United States Patent
Lee et al.

(10) Patent No.: US 7,167,493 B2
(45) Date of Patent: Jan. 23, 2007

(54) METHOD FOR AUTOMATICALLY REVISING WAVELENGTH OF ELECTRO-ABSORPTION MODULATOR INTEGRATED LASER DIODE

(75) Inventors: Jyung-Chan Lee, Daejon (KR); Joon-Ki Lee, Daejon (KR); Yun-Hee Cho, Seoul (KR); Seung-Il Myong, Daejon (KR); Youn-Seon Jang, Daejon (KR); Yool Kwon, Busan (KR); Kwangjoon Kim, Daejon (KR); Moo-Jung Chu, Daejon (KR)

(73) Assignee: Electronics and Telecommunications Research Institute (KR)

( * ) Notice: Subject to any disclaimer, the term of this patent is extended or adjusted under 35 U.S.C. 154(b) by 204 days.

(21) Appl. No.: 10/897,362

(22) Filed: Jul. 21, 2004

(65) Prior Publication Data
US 2005/0111502 A1 May 26, 2005

(30) Foreign Application Priority Data
Nov. 20, 2003 (KR) ...................... 10-2003-0082691

(51) Int. Cl.
*H01S 3/00* (2006.01)
*H01S 3/04* (2006.01)
*H01S 3/10* (2006.01)
*H01S 3/13* (2006.01)
*H01S 3/14* (2006.01)

(52) U.S. Cl. ........................ 372/34; 372/28; 372/32; 372/33; 372/38.07

(58) Field of Classification Search ................ 372/28, 372/32, 33, 34, 38.07
See application file for complete search history.

(56) References Cited

U.S. PATENT DOCUMENTS
6,043,915 A  3/2000  Giles et al.
6,144,025 A  11/2000  Tei et al.
6,369,926 B1  4/2002  Lyu et al.

(Continued)

FOREIGN PATENT DOCUMENTS
KR  1019980015193  4/1998

OTHER PUBLICATIONS
"Wavelength-Stabilized Semiconductor Laser;" IBM Technical Disclosure Bulletin, No. NN83092177, Sep. 1983, US.*

(Continued)

*Primary Examiner*—Minsun Oh Harvey
*Assistant Examiner*—Hrayr A. Sayadian
(74) *Attorney, Agent, or Firm*—Blakely Sokoloff Taylor & Zafman (57) ABSTRACT

The present invention relates to a method for revising a wavelength of the EML by controlling a working temperature based on arithmetic functional relations between the DC-Offset voltage and the wavelength and between the working temperature and the wavelength, and a computer-readable recording medium thereof. The method includes the steps of: re-setting initial values of a working temperature, a amplifying voltage and the DC-Offset voltage; determining a wavelength with respect to the re-set DC-Offset voltage based on a functional relation between the DC-Offset voltage and the wavelength of the EML; and determining the revising working temperature for the determined wavelength based on the functional relation between the working temperature and the wavelength of the EML, and re-setting the working temperature with the revising working temperature.

6 Claims, 5 Drawing Sheets

U.S. PATENT DOCUMENTS

| | | |
|---|---|---|
| 6,516,017 B1 * | 2/2003 | Matsumoto .............. 372/50.11 |
| 6,845,109 B1 * | 1/2005 | Lee et al. ................ 372/29.02 |
| 6,947,458 B1 * | 9/2005 | Moriarty et al. ......... 372/38.02 |
| 2004/0028099 A1 * | 2/2004 | Hongo et al. ............ 372/38.02 |
| 2005/0129077 A1 * | 6/2005 | Lundqvist .................... 372/50 |

OTHER PUBLICATIONS

G.E. Shtengel et al., "Simultaneous Laser Wavelength Locking and Spectral Filtering using Fiber Bragg Grating," (Semiconductor Laser Conference. NARA, IEEE 16th Int'l 1998, vol. 136, No. 3, pp. 269-270).

E.C. Vail et al., "Widely Tunable Micromachined Detectors With Wavelength Tracking," (Laser and Electro-Optics Society Annual Meeting, 1995, pp. 303-304).

H. Masuda et al., "Pump-Wavelength-Locked Erbium-Doped Fibre Amplifier Employing Novel External Cavity For 0-98 μm Laser Diode," (Electronics Letters vol. 28, No. 20, Sep. 1992, pp. 1855-1856).

K.J. Park et al., "A Multi-wavelength Locker for WDM System," (Optical Fiber Communication Conference 2000, vol. 2, WE4-1, 2000, pp. 73-75).

* cited by examiner

METHOD FOR AUTOMATICALLY REVISING WAVELENGTH OF ELECTRO-ABSORPTION MODULATOR INTEGRATED LASER DIODE

FIELD OF THE INVENTION

The present invention relates to a method for automatically revising a wavelength of an electro-absorption modulator integrated laser diode (EML) caused by controlling a DC-Offset voltage; and more particularly, a method for automatically revising a wavelength of an optical beam outputted from an EML by controlling a working temperature of the EML based on a functional relation between a DC-Offset voltage and a wavelength of the optical beam and a functional relation between the working temperature and the wavelength of the optical beam, and a computer-readable recording medium thereof.

DESCRIPTION OF RELATED ART

Operation conditions of an electro-absorption modulator integrated laser diode (EML) are changed according to an optical link configuration in an optical communication system. For example, by controlling a DC-Offset voltage, a chirp condition of an optical beam outputted from the EML is changed since the DC-Offset voltage changes a reflective index of an electro-absorption medium in the EML.

By controlling the DC-Offset voltage, a wavelength of the optical beam is also changed since an optical absorption index of the electro-absorption medium in the EML is changed according to the DC-Offset voltage. That is, the chirp condition and the wavelength of the optical beam are changed according to the DC-Offset voltage.

Therefore, it is necessary to check and re-adjust the wavelength of the optical beam when the DC-Offset voltage is controlled for controlling the chirp condition of the optical beam because the control of the DC-Offset voltage may unnecessarily change the wavelength of the optical beam.

A conventional apparatus for locking a wavelength of the optical beam outputted from the optical transmitter has been introduced in U.S. Pat. No. 6,369,926 issued to Lyu et al., entitled "Multi-channel light source wavelength and strength stabilizing apparatus and method thereof". The conventional apparatus includes a controller for controlling an input current and an input temperature of an optical beam, an optical power splitter for splitting an optical beam outputted from a laser diode, a wavelength locker for reading information about likeness of locking a wavelength of the split optical beam and an amplifier for amplifying a detected error signal. The conventional apparatus locks the wavelength of the optical beam by using the wavelength locker outputting different signals in accordance with the wavelength of the optical source.

As mentioned above, the conventional apparatus uses additional devices such as a wavelength locker or a wavelength meter for reading the wavelength of the optical beam and controls a temperature according to the wavelength of the optical beam read from the wavelength locker or the wavelength meter. Therefore, a cost of operating a laser diode is expense and a size of the conventional apparatus is large.

SUMMARY OF THE INVENTION

It is an object of the present invention to provide a method for simply and quickly revising a wavelength of optical beam outputted from an EML by controlling a working temperature based on a functional relation between a DC-Offset voltage and the wavelength of an optical beam and a functional relation between a working temperature and the wavelength of the optical beam, and a computer-readable recording medium thereof.

In accordance with an aspect of the present invention, there is provided a method for automatically revising a wavelength of an electro-absorption modulator integrated laser diode (EML), the method including the steps of: a) re-setting initial values of a working temperature, a amplifying voltage and the DC-Offset voltage; b) determining a wavelength with respect to the re-set DC-Offset voltage based on a functional relation between the DC-Offset voltage and the wavelength of the EML; and c) determining the revising working temperature for the determined wavelength based on the functional relation between the working temperature and the wavelength of the EML, and re-setting the working temperature with the revising working temperature.

In accordance with another aspect of the present invention, there is provided a computer-readable recording medium for recording a program that implements a method for automatically revising a wavelength of an electro-absorption modulator integrated laser diode (EML), the method including the steps of: a) re-setting initial values of a working temperature, a amplifying voltage and the DC-Offset voltage; b) determining a wavelength with respect to the re-set DC-Offset voltage based on a functional relation between the DC-Offset voltage and the wavelength of the EML; and c) determining the revising working temperature for the determined wavelength based on the functional relation between the working temperature and the wavelength of the EML, and re-setting the working temperature with the revising working temperature.

A semiconductor laser as an optical source is various semiconductor compound of In, Ga, As, Si, etc. A wavelength of the optical source is determined with respect to an amount of an energy transition.

An electro-absorption modulator (EAM) is used for modulating an optical beam. The EAM can modulate an intensity of the optical beam by absorbing an optic according to electricity provided to an optical absorption medium having a Multi-Quantum Well (MQW) structure.

Therefore, because an electro-absorption modulator integrated laser diode (EML) can grow a semiconductor laser and the EAM on a same wafer with having a reasonable a lattice constant, the EML is importantly recognized as the optical source of the optical communication system in view of a miniaturization and high performance recently.

Operation conditions of the EML have to be changed according to an optical link configuration in the optical communication system. A change of a reflective index in an optical absorption medium according to the DC-Offset voltage inputting to the EML changes a chirp condition of the optical beam outputted from the EML.

It is necessary that the chirp condition is controlled with respect to the optical link configuration. Wherein, the DC-Offset voltage is used to control the chirp condition. Meanwhile the change of the DC-Offset voltage changes the optical absorption coefficient in the optical absorption medium, and derives a wavelength change, which is importantly considered in an Ultra Wavelength Division Multiplexing (UWDM) optical communication system. Accordingly, the change of the DC-Offset voltage changes the chirp and the working wavelength of the optical beam simultaneously.

The present invention is related to a method for revising the wavelength of the EML caused by controlling the DC-Offset voltage into a predetermined wavelength. The EML is an optical generator of an optical transceiver in the UWDM optical communication system as the optical source.

Therefore, the present invention is related to the method for revising the wavelength by calculating arithmetic functional relations between the DC-Offset voltage and the wavelength and between the working temperature and the wavelength based on experimental data, forecasting a wavelength transition based on the arithmetic functional relations and forecasting a temperature to be re-adjusted.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, a method for automatically revising a wavelength of an optical beam outputted from an EML in accordance with a preferred embodiment of the present invention will be described in detail with reference to the accompanying drawings.

Figure 1:
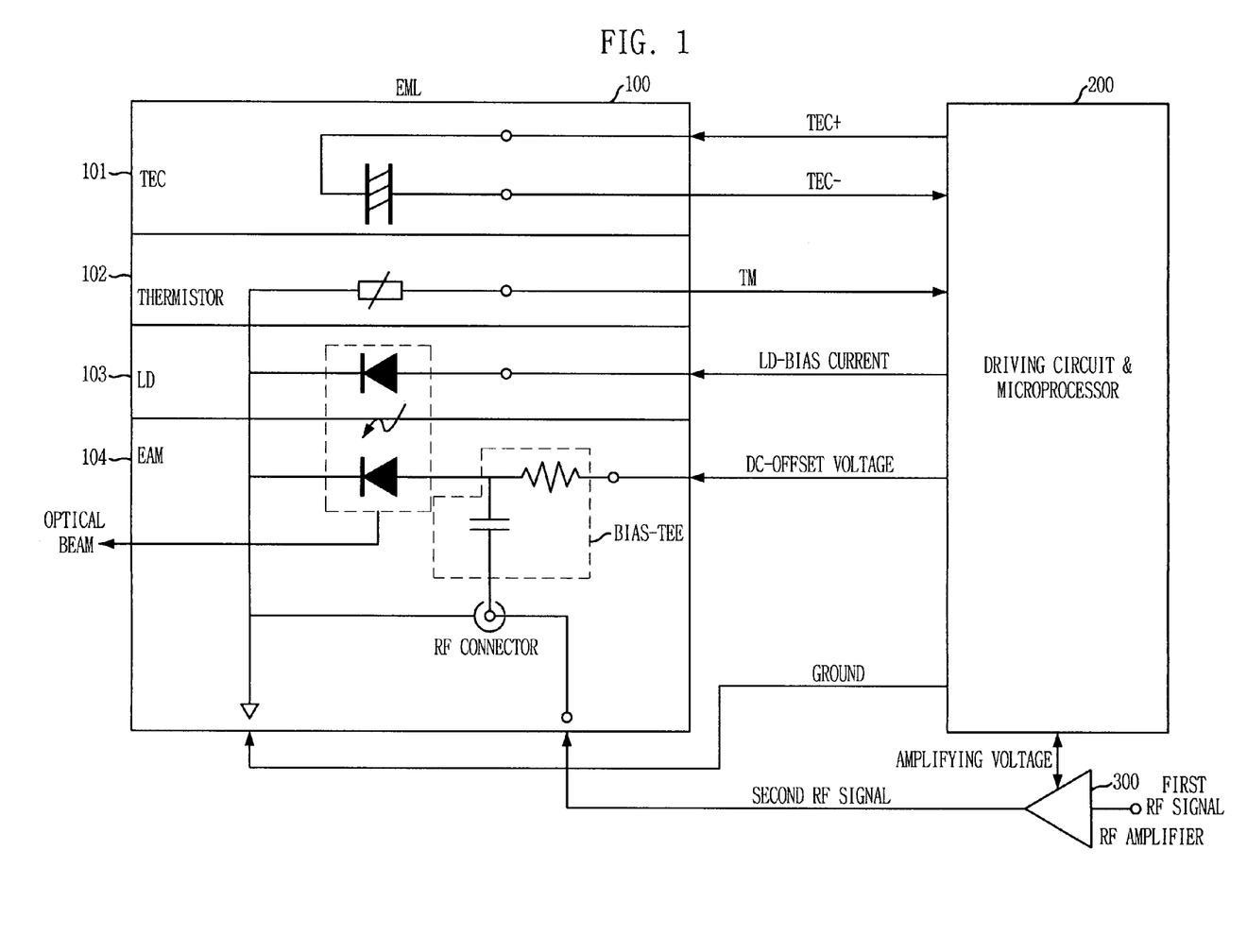
FIG. 1 is a block diagram illustrating an apparatus for automatically revising a wavelength of an optical beam outputted from an EML by controlling a working temperature in accordance with an embodiment of the present invention.

FIG. 1 is a block diagram illustrating an apparatus for automatically revising a wavelength of an EML in accordance with a preferred embodiment of the present invention.

The apparatus includes an EML 100, a driving circuit & microprocessor 200 and an amplifier 300.

As shown, the EML 100 includes a thermo-electric cooler (TEC) 101 for varying a working temperature of the EML 100, a thermistor 102 for reading the working temperature of the EML 100, a laser diode (LD) 103 for generating an optical beam and an electro-absorption modulator (EAM) 104 for modulating the optical beam outputted from the LD 103 according to a radio frequency (RF) signal.

The TEC 101 is an electric cooler for controlling a working temperature of the EML 100. The thermistor 102 has a resistance that is changed according to an external temperature. The thermistor 102 generates a thermistor monitoring signal (TM) including information about the working temperature of the EML 100.

The apparatus changes the working temperature of the EML 100 by using the TEC 101 based on the TM from the thermistor 102.

The LD 103 receives a LD-bias current and generates an optical beam with respect to the LD-bias current. The generated optical beam is propagated to the EAM 104.

The EAM 104 receives the optical beam from the LD 103, modulates the optical beam and outputs the modulated optical beam to an optical fiber (not shown). The EAM 104 receives a DC-Offset voltage and a second RF input signal. The EAM 104 includes an electric input end connected to a line receiving the second RF signal, wherein the line has an impedance of 50 ohm. That is, the EAM 104 modulates the optical beam from the DL 103 in response to the second RF signal.

According to the second RF signal, an intensity of the second RF signal is changed by applying different levels of DC-Offset voltage and an absorption index of EAM is changed. Therefore, the EAM 104 absorbs the optical beam according to the intensity of the second RF signal.

The DC-Offset voltage is applied to the EAM 104 for changing a chirp characteristic of an optical beam.

The chirp characteristic affects to transmission performance by interact with an amount of dispersion in an optical link. Therefore, the DC-Offset voltage is controlled and applied to the EAM 104 according to a dispersion state of the optical link.

By controlling the DC-Offset voltage, the output wavelength is also changed unnecessarily. (Refer to FIGS. 2 to 5).

A driving circuit and microprocessor 200 controls the EML 100 for revising a wavelength of the optical beam by eliminating an un-wanted wavelength change. That is, the driving circuit and microprocessor 200 receives the TM from the thermistor 102 and controls a temperature of the EML 100 according to the TM for revising a wavelength of the optical beam. Also, the driving circuit and microprocessor 200 generates the LD-Bias voltage and the DC-Offset voltage to oscillate the optical beam from the LD 103 and to modulate the optical beam at the EAM 104. Furthermore, the driving circuit and microprocessor 200 generates an amplifying voltage to controls the RF amplifier 300.

The wavelength of the optical beam outputted from the EAM 104 is regularly changed according to the DC-Offset voltage and is also changed according to an intensity of the second RF signal.

Accordingly, in the present invention, the wavelength are revised by reading the working temperature of the EML 100 based on the TM from the thermistor 102 when the DC-Offset voltage is changed and controlling the temperature of the EML 100 based on the TM by using a method of the present invention after the intensity of the second RF signal is determined.

The method for determining a working temperature of EML in order to revise wavelength change of optical beam is explain by referring to FIGS. 2 to 7 herein after.

Figure 2:
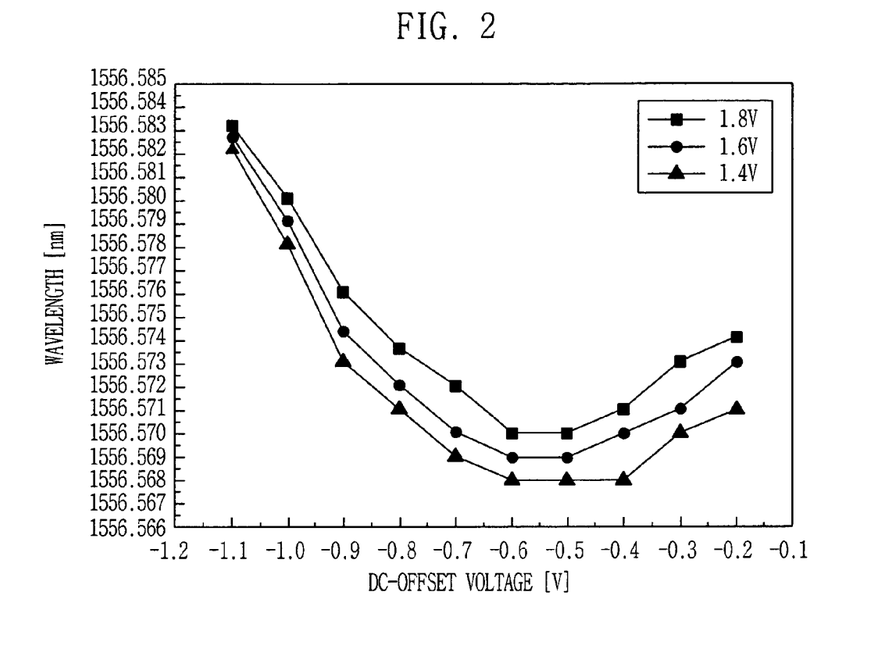
FIG. 2 is a graph describing wavelength of the EML with respect to the DC-Offset voltage in accordance with the present invention.

FIG. 2 is a graph showing wavelength of an optical beam outputted from an EML 100 according to DC-Offset voltage changes.

With wavelength-meter, various phenomena of wavelength of a conventional EML can be measured in accordance with varying DC-Offset and amplifying voltages.

As shown, when the input DC-Offset voltage is changed in a range from 1.1 V to −0.2 V, a wavelength of the optical beam is changed in a range from 1556.568 to 1556.584 nm. The above-mentioned, the characteristic of the measured wavelength is varied with respect to an amplifying voltage.

In other words, there are different wavelengths generated according to the amplifying voltages.

Figure 3:
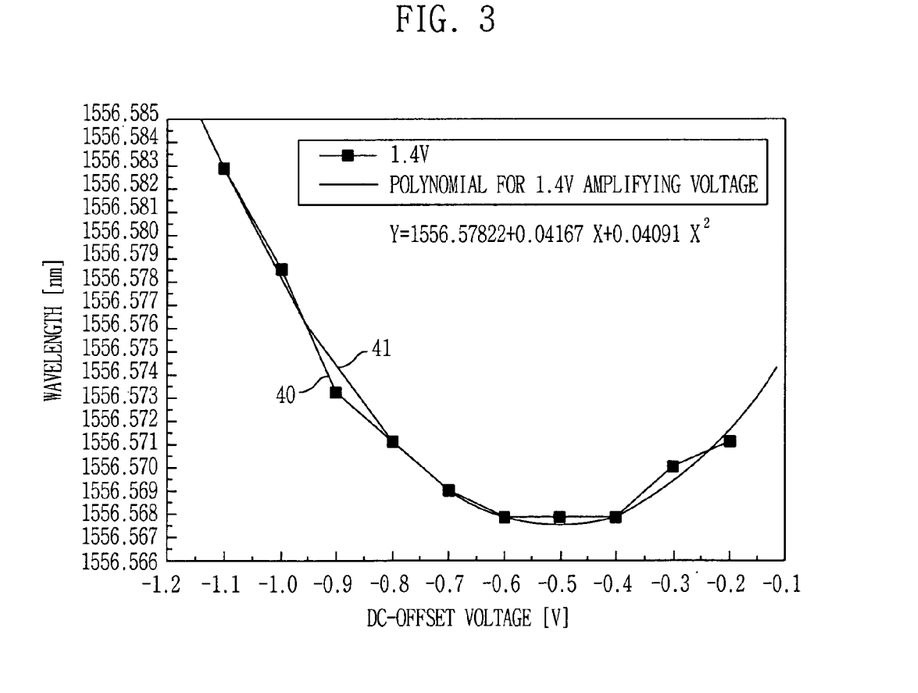
FIG. 3 is a graph showing wavelength of the EML with respect to the DC-Offset of a 1.4V amplifying voltage.

FIG. 3 is a graph showing wavelength changes of an optical beam outputted from an EML according to a DC-Offset voltage when an amplifying voltage is 1.4V.

As shown, a curve 40 represents wavelength changes according to the DC-Offset voltage when the amplifying voltage is 1.4V and a curve 41 is generated by a quadratic function. That is, based on the curve 40, the quadratic function generating the curve 41 identical to the curve 40 can be obtained by fitting the curve 40. The quadratic function is:

$$y=0.04091x^2+0.04167x+1556.57822 \qquad \text{Eq. (1)}$$

wherein x is a DC-Offset voltage and y is a wavelength of an optical beam.

Figure 4:
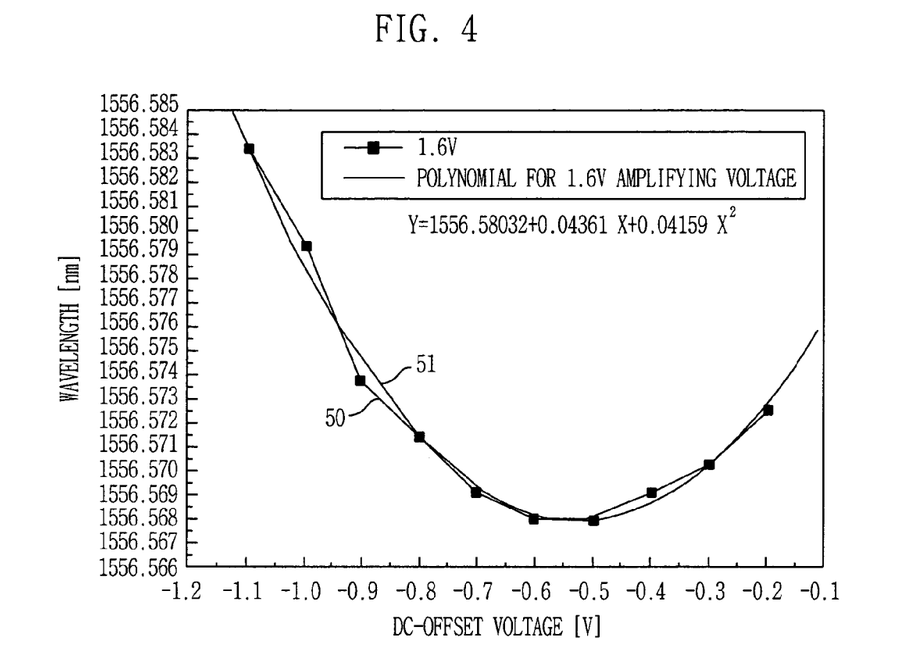
FIG. 4 is a graph showing wavelength of the EML with respect to the DC-Offset of a 1.6V amplifying voltage.

FIG. 4 is a graph showing wavelength changes of an optical beam outputted from an EML according to a DC-Offset voltage when an amplifying voltage is 1.6V.

As shown, a curve 50 represents wavelength changes according to the DC-Offset voltage when the amplifying voltage is 1.6V and a curve 51 is generated by a quadratic function. That is, based on the curve 50, the quadratic function generating the curve 51 identical to the curve 50 can be obtained by fitting the curve 50. The quadratic function is:

$$y=0.04159x^2+0.04361x+1556.58032 \qquad \text{Eq. (2)}$$

wherein x is a DC-Offset voltage and y is a wavelength of an optical beam.

Figure 5:
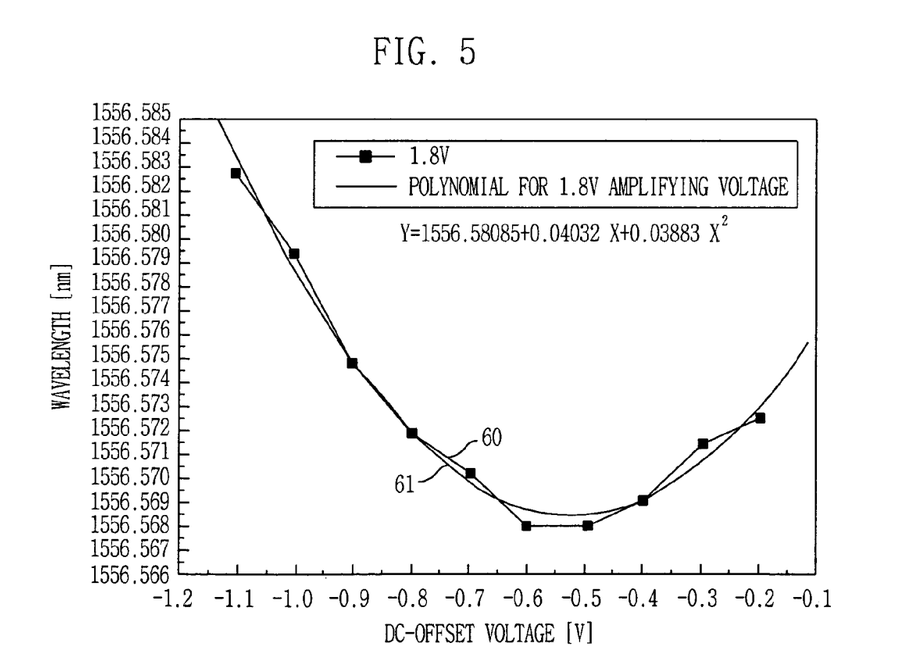
FIG. 5 is a graph showing wavelength of the EML with respect to the DC-Offset of a 1.8V amplifying voltage.

FIG. 5 is a graph showing wavelength changes of an optical beam outputted from an EML according to a DC-Offset voltage when an amplifying voltage is 1.8V.

As shown, a curve 60 represents wavelength changes according to the DC-Offset voltage when the amplifying voltage is 1.8V and a curve 61 is generated by a quadratic function. That is, based on the curve 60, the quadratic function generating the curve 61 identical to the curve 60 can be obtained by fitting the curve 60. The quadratic function is:

$$y=0.03883x^2+0.04032x+1556.58085 \qquad \text{Eq. (3)}$$

wherein x is a DC-Offset voltage and y is a wavelength of an optical beam.

Figure 6:
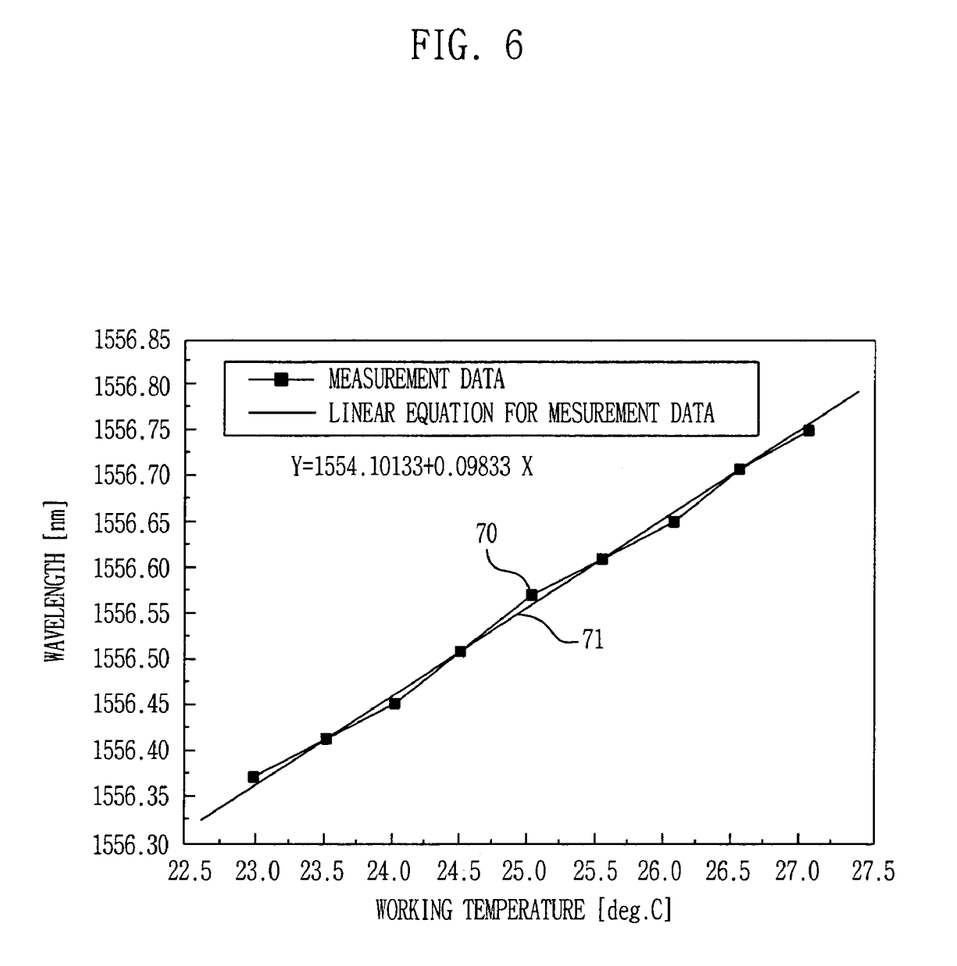
FIG. 6 is a graph showing wavelength of the EML with respect to a working temperature.

FIG. 6 is a graph showing wavelength changes of an optical beam outputted from an EML according to a working temperature of the EML.

As shown, a curve 70 shows wavelength changes according to working temperatures and another curve 71 is generated by a linear function. That is, based on the curve 70, the linear function generating the curve 71 identical to the curve 70 can be obtained by fitting the curve 70. The linear function is:

$$y=0.09833x+1554.10133 \qquad \text{Eq. (4)}$$

wherein x is a working temperature and y is a wavelength of an optical beam. Based on Eq. 1, 2 or 3, the wavelength y is calculated and the working temperature x is calculated based on the Eq. 4 in order to revise the wavelength y.

Therefore, the wavelength y can be calculated based on one of the Eqs. 1, 2 and 3 corresponding to an amplifying voltage with the DC-Offset voltage x. Based on the forecasted wavelength by calculating y, the working temperature x can be calculated based on the Eq. 4 for controlling a working temperature in order to revise wavelength changes.

Accordingly, the wavelength of the EML can be revised by controlling the working temperature in accordance with the present invention.

The present invention revises the wavelength changes by using arithmetic functional relations calculated from the experimental data of FIGS. 2, 3, 4, 5 and 6.

From the experimental data of FIGS. 3, 4 and 5, a quadric function in forms of $y=ax^2+bx+c$, i.e., a relation between the DC-Offset voltage and the output wavelength is calculated. From the experimental data of, FIG. 7, a linear function in form of $y=dx+e$, i.e., a relation between the working temperature and the output wavelength is calculated.

Based on the quadric functions and a linear function, the wavelength changes are calculated and a revising temperature for revising the wavelength changes is calculated. Then, the working temperature is adjusted to the revising temperature.

Figure 7:
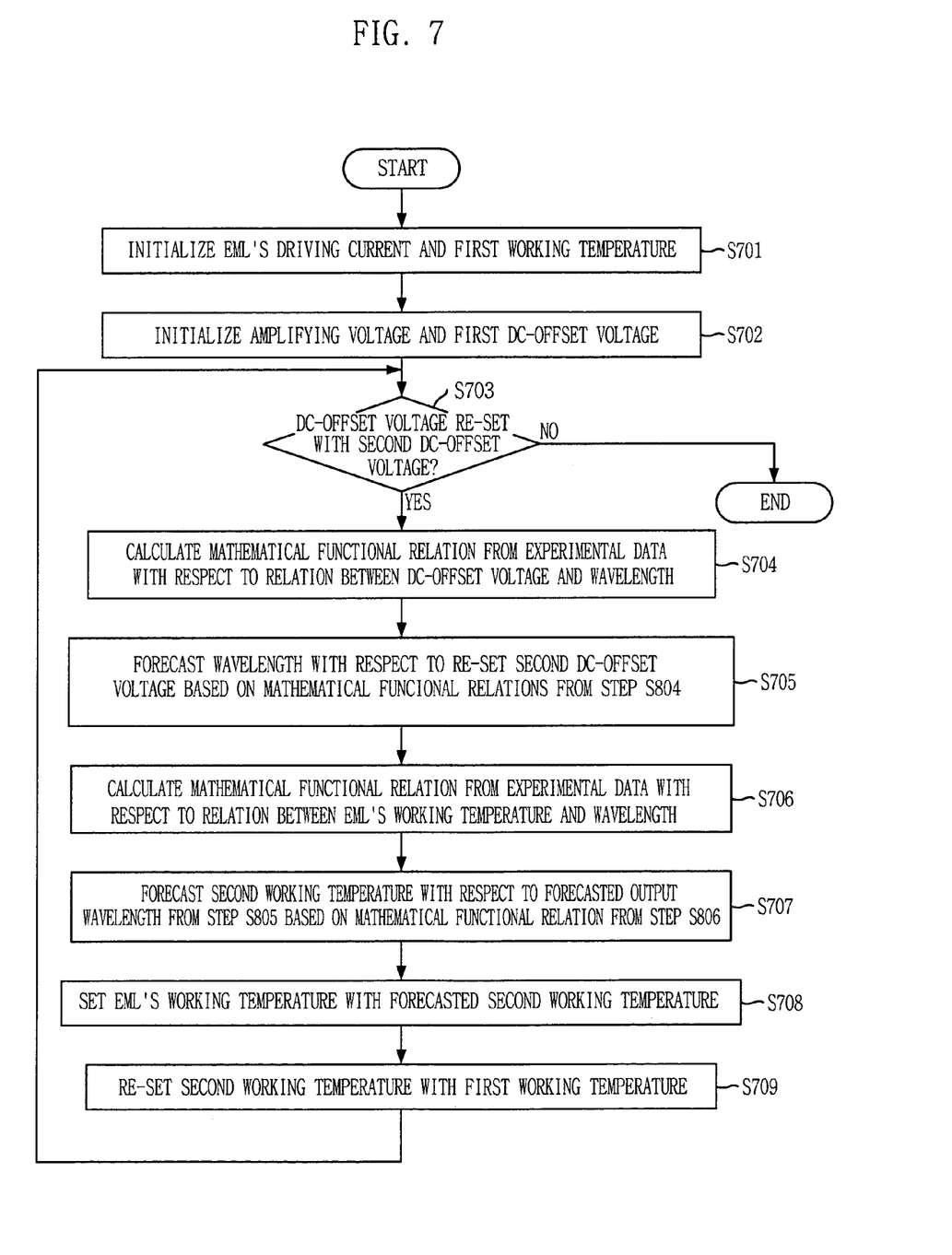
FIG. 7 is a flowchart illustrating a method for automatically revising a wavelength of an EML in accordance with a preferred embodiment of the present invention.

FIG. 7 is a flowchart illustrating a method for determining a working temperature of an EML in order to automatically revise wavelength changes of an optical beam generated from an EML in accordance with a preferred embodiment of the present invention.

As shown, a driving current and a first working temperature of the EML are initialized at step S701.

At step S702, an amplifying voltage and a first DC-Offset voltage are initialized.

When the initialized driving current, the initialized working temperature, the initial DC-Offset voltage and the initialized amplifying voltage are controlled, the first DC-Offset voltage is changed to second DC-Offset voltage at step S703.

A functional relation between a wavelength of the optical beam and the second DC-Offset voltage is determined and a quadratic function is obtained according to the determined functional relation at step S704. Determining the functional relation and obtaining quadratic function was described by referring to FIG. 2 to 5.

After obtaining the quadratic function, a wavelength of an optical beam corresponding to the second DC-Offset voltage is predicted by using the quadratic function at step S705.

After predicting the wavelength, another functional relation between a wavelength of the optical beam and the working temperature is determined and a linear function is obtained by using the function relation at step S706.

By using the linear function, a revising working temperature for revising the wavelength changes is determined at step S707.

At step S708, the EML is controlled by adjusting a current working temperature to the revising working temperature.

The first working temperature is set the revising working temperature at step S709, the operation of the step S703 is performed.

As above-mentioned, the method of the present invention can be embodied as a program and stored in recording media readable by a computer, e.g., CD-ROM, RAM, floppy disk, hard disk, magneto-optical disk, etc.

The present invention simply and quickly revises the wavelength occurred by the change of the DC-Offset voltage after a user sets a wavelength of the EML.

Therefore, the present invention simply and quickly revises the wavelength by controlling the working temperature based on a quadric function between the DC-Offset voltage and the wavelength, and a linear function between the working temperature and the wavelength without using an additional wavelength locker or a wavelength meter.

The present application contains subject matter related to Korean patent application No. 2003-82691, filed in the Korean Intellectual Property Office on Nov. 20, 2003, the entire contents of which being incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A method for automatically revising a wavelength of an electro-absorption modulator integrated laser diode (EML), the method comprising the steps of:
    a) initializing values of a working temperature, an amplifying voltage and a DC-Offset voltage, and resetting the DC-Offset voltage, wherein the amplifying voltage controls absorption of the electro-absorption modulator;
    b) determining a wavelength with respect to the re-set DC-Offset voltage based on a first functional relation between the DC-Offset voltage and the wavelength of the EML under the amplifying voltage;
    c) determining a revising working temperature for the determined wavelength based on a second functional relation between the working temperature and the wavelength of the EML; and
    d) re-setting the working temperature with the revising working temperature.

2. The method as recited in claim 1, wherein the step b) includes the steps of
    b1) obtaining the first functional relation between the DC-Offset voltage and the wavelength with respect to the amplifying voltage, and;
    b2) determining a wavelength based on the re-set DC-Offset voltage in accordance with the step a) based on the obtained first functional relation in accordance with the step b1).

3. The method as recited in claim 2, wherein the first functional relation with respect to a fixed amplifying voltage is a quadratic function.

4. The method as recited in claim 1, wherein the step c) includes the steps of:
    c1) analyzing the second functional relation between the working temperature and the wavelength of the EML;
    c2) determining the revising working temperature for the determined wavelength in accordance with the step b) based on the second functional relation in accordance with the step c1); and
    c3) re-setting the working temperature of the EML with the revising working temperature in accordance with the step c2) in order to revise the output wavelength change.

5. The method as recited in claim 4, wherein the step c1), the second functional relation is a linear function.

6. A computer-readable recording medium having instructions therein which when executed cause a machine to automatically revise a wavelength of an electro-absorption modulator integrated laser diode (EML), the machine-readable medium comprising instructions operable to:
    a) initialize values of a working temperature, an amplifying voltage and a DC-Offset voltage, and reset the DC-Offset voltage, wherein the amplifying voltage controls absorption of the electro-absorption modulator;
    b) determine a wavelength with respect to the re-set DC-Offset voltage based on a first functional relation between the DC-Offset voltage and the wavelength of the EML;
    c) determine a revising working temperature for the determined wavelength based on a second functional relation between the working temperature and the wavelength of the EML, and
    d) re-set the working temperature with the revising working temperature.

* * * * *